United States Patent [19]

Wu

[11] Patent Number: 5,435,384
[45] Date of Patent: Jul. 25, 1995

[54] HEAT DISSIPATING PLATE

[76] Inventor: Chung Wu, No. 184, Chung Hsing N. St., San Chung, Taipei Hsein, Taiwan

[21] Appl. No.: 277,625

[22] Filed: Jul. 20, 1994

[51] Int. Cl.⁶ .................................................. F28F 3/04
[52] U.S. Cl. ...................................... 165/185; 165/133
[58] Field of Search ................ 165/135, 185; 361/704; 174/16.3; 257/721, 722

[56] References Cited

U.S. PATENT DOCUMENTS

| | | | |
|---|---|---|---|
| 3,299,949 | 1/1967 | Beurtheret | 165/185 |
| 3,364,987 | 1/1968 | Bylund et al. | 174/16.3 X |
| 4,638,858 | 1/1987 | Chu | 165/185 |
| 5,052,476 | 10/1991 | Sukumoda et al. | 165/133 |

FOREIGN PATENT DOCUMENTS 4-369391  12/1992  Japan .................................... 165/185

Primary Examiner—Allen J. Flanigan
Attorney, Agent, or Firm—Browdy and Neimark

[57] ABSTRACT

A heat dissipating plate having rows of upright radiating rods and rows of V-shaped radiating fins alternatively aligned at the top of a flat base thereof, each two adjacent V-shaped radiating fins of the same row defining an air passage for letting heat be quickly carried away by air.

1 Claim, 4 Drawing Sheets

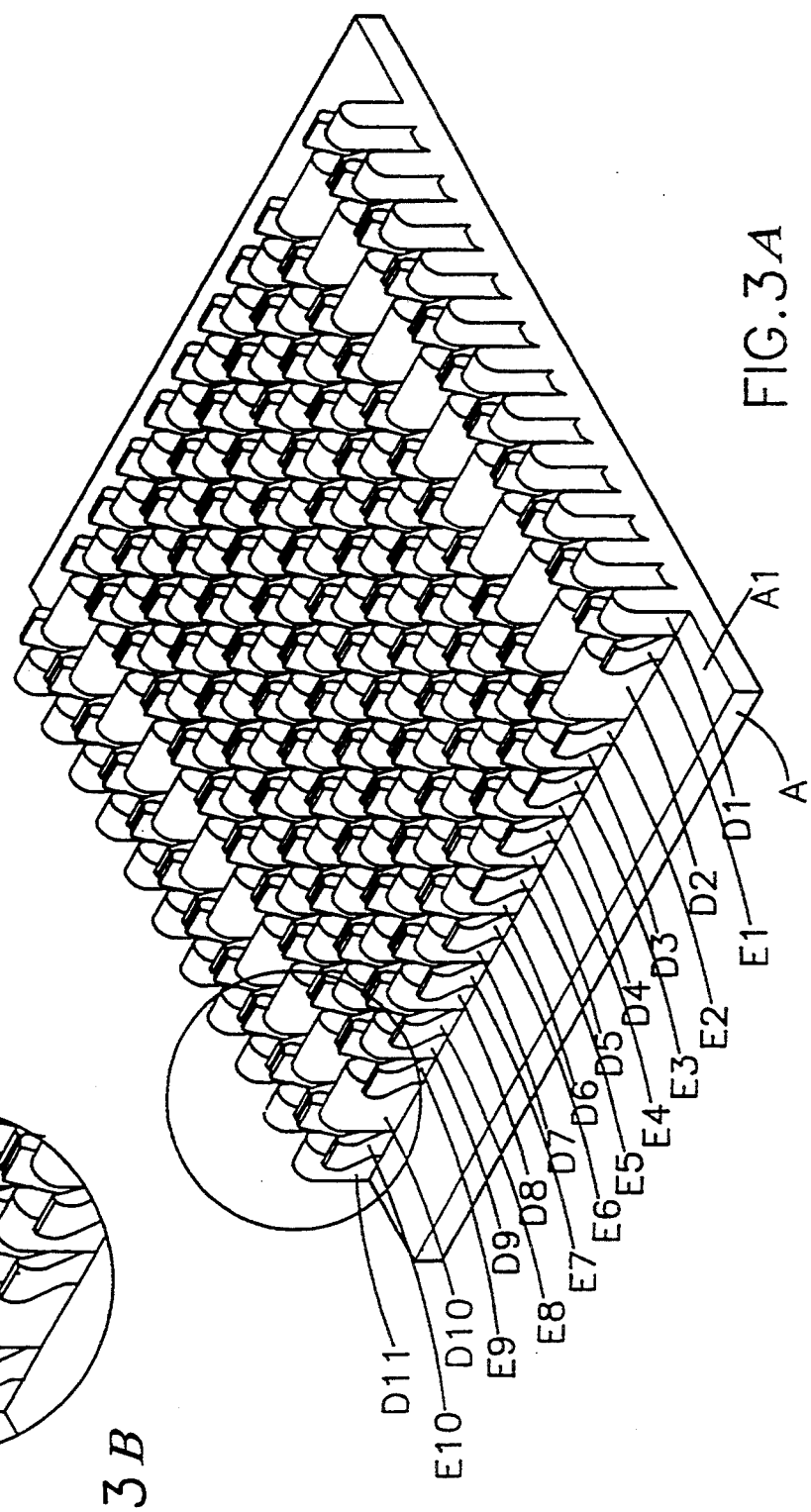
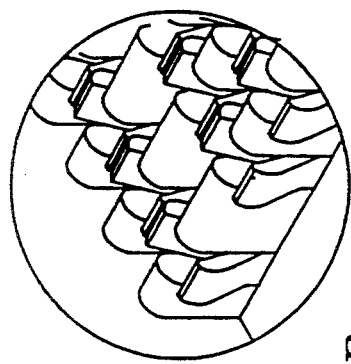
FIG. 3A
FIG. 3B

HEAT DISSIPATING PLATE

BACKGROUND OF THE INVENTION

The present invention relates to heat dissipating plates, and more particularly to a high-efficiency heat dissipating plate for use in an electronic apparatus to quickly carry heat away.

Various radiating flanges and devices have been disclosed for use in electronic apparatus such as computers, etc., for carrying heat away from the apparatus. FIG. 1 shows a heat dissipating plate according to the prior art. The heat dissipating plate A comprises a flat base A1 having elongated flanges B1 through B11 raised from the top and spaced from one another by gaps C. This structure of heat dissipating plate is extruded from aluminum. If one attempts to increase the number of the flanges B1 through B11 in order to increase the heat dissipating area, the extrusion process becomes difficult to perform, and the manufacturing cost of the heat dissipating plate will be greatly increased. FIG. 2 shows another structure of heat dissipating plate according to the prior art. This structure of heat dissipating plate is made by cutting the flanges B1 through B11 into a plurality of heat dissipating fins D1 through D11. During the cutting process to cut the flanges B1 through B11 into a plurality of heat dissipating fins D1 through D11, aluminum chips will pollute the air. After cutting, the sharp edges of the heat dissipating fins D1 through D11 must be smoothened or the operator's hands may be injured easily. Besides, this arrangement provides little improvement in heat dissipating efficiency.

SUMMARY OF THE INVENTION

The present invention has been accomplished to provide a heat dissipating plate which eliminates the aforesaid drawbacks. It is one object of the present invention to provide a heat dissipating plate which is integrally made through a punching process. It is another object of the present invention to provide a heat dissipating plate which greatly increases the heat dissipating area for quickly carrying heat away. It is still another object of the present invention to provide a heat dissipating plate which has no sharp edges when finished, and therefore does not injure the operator's hands during the installation.

To achieve the aforesaid objects, there is provided a heat dissipating plate made from aluminum through a punching process, having rows of upright radiating rods and rows of V-shaped radiating fins alternatively aligned at the top of a flat base thereof, wherein each two adjacent V-shaped radiating fins of the same row define an air passage for letting heat be quickly carried away by air.

BRIEF DESCRIPTION OF THE DRAWINGS

FIG. 3A is an elevational view of a heat dissipating plate according to the present invention; and FIG. 3B is an enlarged view of the circled area of FIG. 3A.

DETAILED DESCRIPTION OF THE PREFERRED EMBODIMENT

Figure 1:
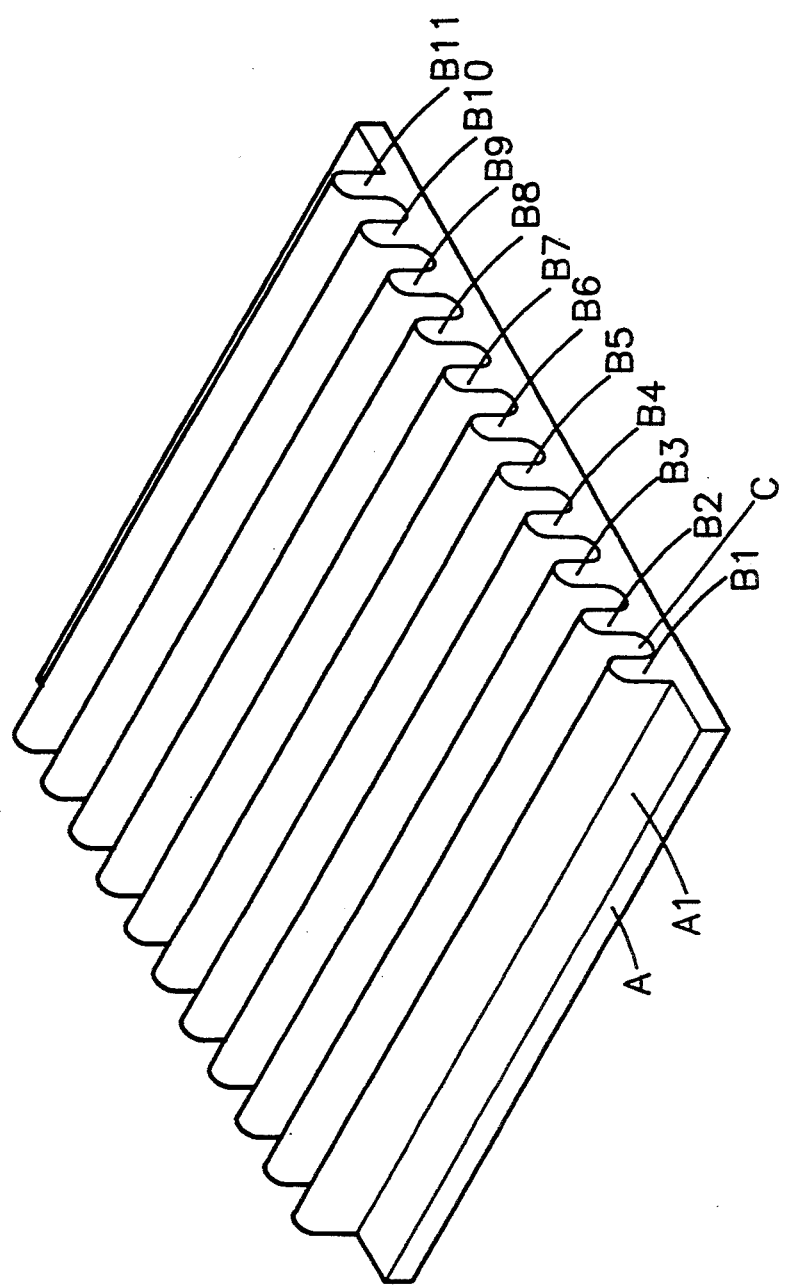
FIG. 1 is an elevational view of a heat dissipating plate according to the prior art.
Figure 2:
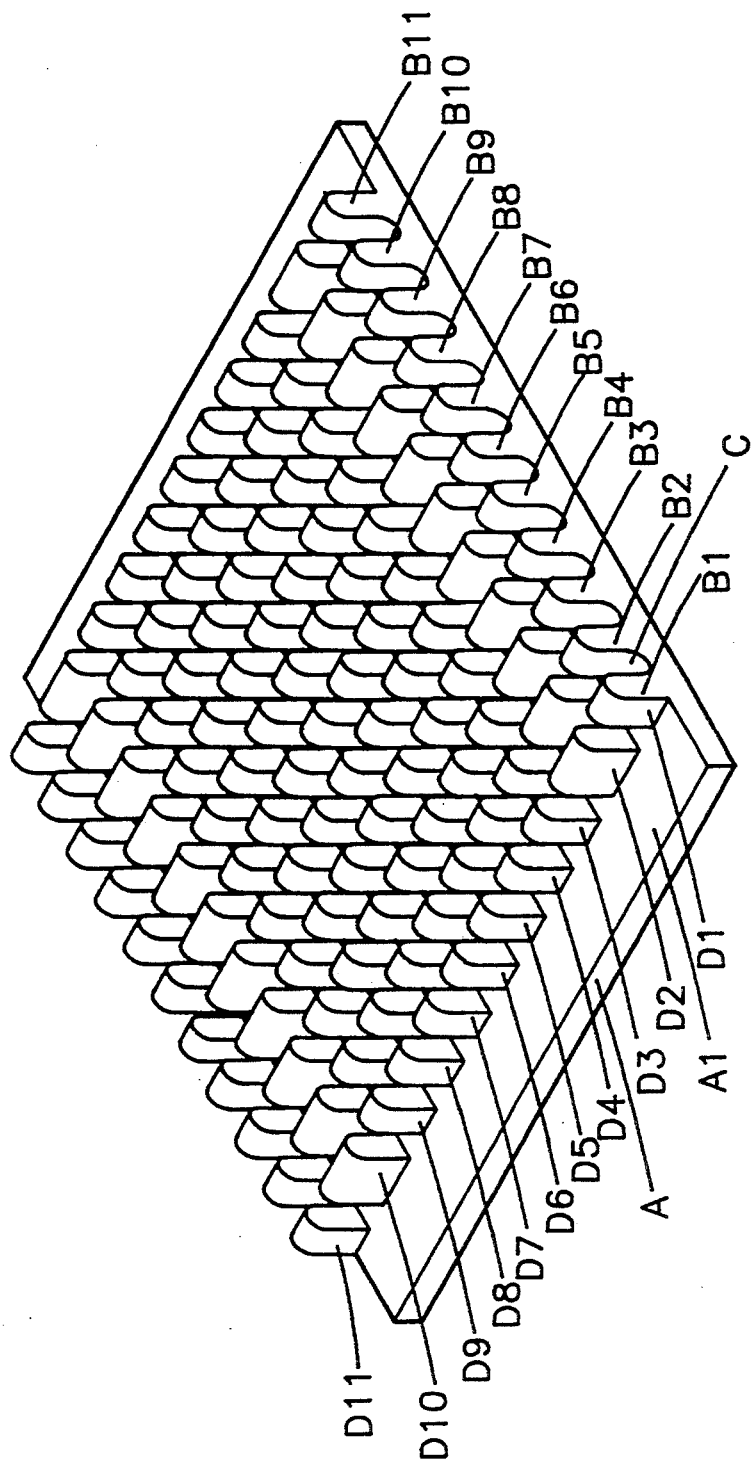
FIG. 2 is an elevational view of another heat dissipating plate according to the prior art.
Figure 4:
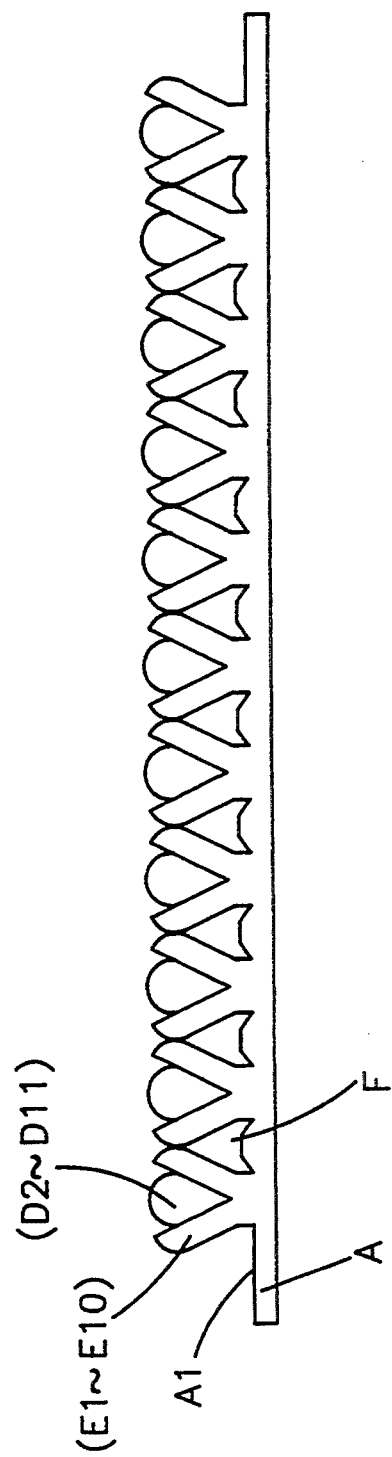
FIG. 4 is a side view in plain of the heat dissipating plate shown in FIG. 3.

Referring to FIGS. 3A and 4, a heat dissipating plate A in accordance with the present invention is integrally made through a punching process, generally comprised of a flat base A having rows of upright radiating rods D1 through D11 and rows of V-shaped radiating fins E1 through E10 alternatively aligned at the top. The radiating rods D1 through D11 are made of different sizes. The V-shaped radiating fins E1 through E10 are respectively aligned between either two adjacent rows of upright radiating rods D1 through D11.

Referring to FIG. 4, each two adjacent V-shaped radiating fins E of the same row define an air passage F for letting heat be quickly carried away by air. The arrangement of the V-shaped radiating fins E1 through E10 greatly increase the heat dissipating area of the heat dissipating plate A, and therefore the dissipating efficiency of the heat dissipating plate A is greatly improved.

What is claimed is:

1. A heat dissipating plate comprising a flat base having alternating rows of upright radiating rods and rows of V-shaped radiating fins aligned at the top, each two adjacent V-shaped radiating fins of the same row defining an air passage for letting heat be quickly carried away by air.

* * * * *